(12) United States Patent
Huang

(10) Patent No.: US 6,255,692 B1
(45) Date of Patent: Jul. 3, 2001

(54) TRENCH-GATE SEMICONDUCTOR DEVICE

(75) Inventor: Eddie Huang, Stockport (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/372,961

(22) Filed: Aug. 12, 1999

(30) Foreign Application Priority Data

Aug. 14, 1998 (GB) .................................................. 9817643

(51) Int. Cl.$^7$ ...................................................... H01L 29/76
(52) U.S. Cl. ...................... 257/341; 257/329; 257/330; 257/331
(58) Field of Search ............................... 257/328, 329, 257/330, 331, 334, 341; 438/212, 259, 268, 270, 589

(56) References Cited

U.S. PATENT DOCUMENTS

| | | | |
|---|---|---|---|
| 5,451,800 | * 9/1995 | Mohammad | 257/191 |
| 5,473,176 | * 12/1995 | Kakumoto | 257/192 |
| 5,698,869 | 12/1997 | Yoshimi et al. | 257/192 |
| 5,703,383 | * 12/1997 | Nakayama | 257/139 |

FOREIGN PATENT DOCUMENTS

| | | |
|---|---|---|
| 01196874A | 8/1989 | (JP) . |
| 02184078A | 7/1990 | (JP) . |

\* cited by examiner

*Primary Examiner*—Eddie C. Lee
*Assistant Examiner*—George C. Eckert, II
(74) *Attorney, Agent, or Firm*—Steven R. Biren

(57) ABSTRACT

A trench-gate power device, for example a MOSFET, has a semiconductor body (10), for example of monocrystalline silicon, comprising a plurality of side-by-side body regions (3) which accommodate parallel conduction channels (12) adjacent the trench-gate structure (33,23,20) of the device. The channels (12) are connected in parallel between a first main electrode (21) which is common to side-by-side source regions (1) and a second region (2) which is common to the side-by-side body regions (3). The side-by-side source regions (1) comprise a layer (11) of narrow-bandgap semiconductor material ($Si_xGe_{(1-x)}$) which is deposited on a major surface (10*a*) of the body (10) to form a source p-n heterojunction (31) with the side-by-side body regions (3) of the body (10). This narrow-bandgap semiconductor material ($Si_xGe_{(1-x)}$) serves to suppress second breakdown of the power device, so improving its ruggedness. Advantageously, at least some of the body regions (3) are short-circuited to the electrode (21) so as to determine their potential.

10 Claims, 3 Drawing Sheets

US 6,255,692 B1

TRENCH-GATE SEMICONDUCTOR DEVICE

BACKGROUND OF THE INVENTION

This invention relates to a trench-gate semiconductor device including a region comprising a narrow-bandgap semiconductor material. In particular, the invention provides a trench-gate power semiconductor device such as, for example, an insulated-gate field-effect transistor (commonly termed a power MOSFET).

United States patent specification U.S. Pat. No. 5,698,869 discloses a trench-gate semiconductor device comprising a semiconductor body having a first major surface from which a trench-gate structure extends into the body. The body includes a body region of a first conductivity type which extends adjacent to the trench-gate structure. This body region provides the device with a channel-accommodating portion between first and second regions of an opposite second conductivity type in a current-carrying path of the device. The first region comprises a narrow-bandgap semiconductor material which is of the second conductivity type and of narrower energy bandgap than the semiconductor body so providing a heterojunction. The whole contents of U.S. Pat. No. 5,698,869 are hereby incorporated herein as reference material.

The devices disclosed in U.S. Pat. No. 5,698,869 have their body region at a floating potential, which in most cases is due to a so-called SOI (silicon on insulator) formation for the device. The inclusion of the narrow-bandgap semiconductor material suppresses this "floating body effect", reducing leakage current across the device and improving drain breakdown voltage. Most embodiments in U.S. Pat. No. 5,698,869 are DRAM (dynamic random access memory) cells, the holding characteristics of which are improved by the inclusion of the narrow-bandgap semiconductor material in an interior of a drain region of the DRAM cell-select transistor. This drain region is formed adjacent to the trenched, first major surface of the semiconductor body. In these embodiments, the narrow-bandgap semiconductor material is formed in this region by ion implantation, and particularly by implantation of germanium ions into monocrystalline silicon.

SUMMARY OF THE INVENTION

The present invention is based on a recognition by the inventors that narrow-bandgap semiconductor material can be used advantageously in a new and particular manner, in the context of a trench-gate power semiconductor device to improve characteristics of the power device that are quite different from the characteristics of the devices of U.S. Pat. No. 5,698,869.

According to the present invention, there is provided a trench-gate semiconductor device which is a power device, and the trench-gate structure of which extends between the channel-accommodating portions of neighbouring side-by-side body regions of the device. These channel-accommodating portions are connected in parallel between a first main electrode (common to side-by-side source regions) and the second region (common to the side-by-side body regions). The narrow-bandgap material in this power device is doped to provide these source regions which form with the body regions a source p-n junction that comprises the heterojunction. This p-n heterojunction serves to suppress so-called "second breakdown", which would otherwise result from the turning on of a parasitic bipolar transistor (formed by the body region of the first conductivity type between the first/source and second regions of the second conductivity type) in a high-current high-voltage condition between the first main electrode and the second region. This improves the safe operating area (SOA) of the power device, also termed its "ruggedness".

A narrow-bandgap layer on the first major surface of the semiconductor body provides the side-by-side source regions outside the semiconductor body. The heterojunction acts in combination with the source p-n junction in such a way that the injection of charge carriers of the second conductivity type from the source regions into the body regions of the first conductivity type is very much lower than the injection of charge carriers of the first conductivity type from the body regions into the source regions. Thus, the parasitic transistor now has a very low gain.

If the device begins to approach a second breakdown condition in which an avalanche current of charge carriers of the first conductivity type begins to flow from the body regions into the source regions, then the current flow of charge carriers of the second conductivity type from the source regions into the body regions is suppressed by the p-n heterojunction, so avoiding turn-on of the parasitic bipolar transistor. As a result, the body regions can have a low doping concentration of the first conductivity type, without their doping needing to be locally increased to suppress the gain of the parasitic bipolar transistor. The layout geometry of this power device can be compact. Its manufacture can also be simplified.

BRIEF DESCRIPTION OF THE DRAWINGS

These and other features of the present invention are illustrated, by way of example, in embodiments now to be described with reference to the accompanying diagrammatic drawings, in which.

Figure 1:
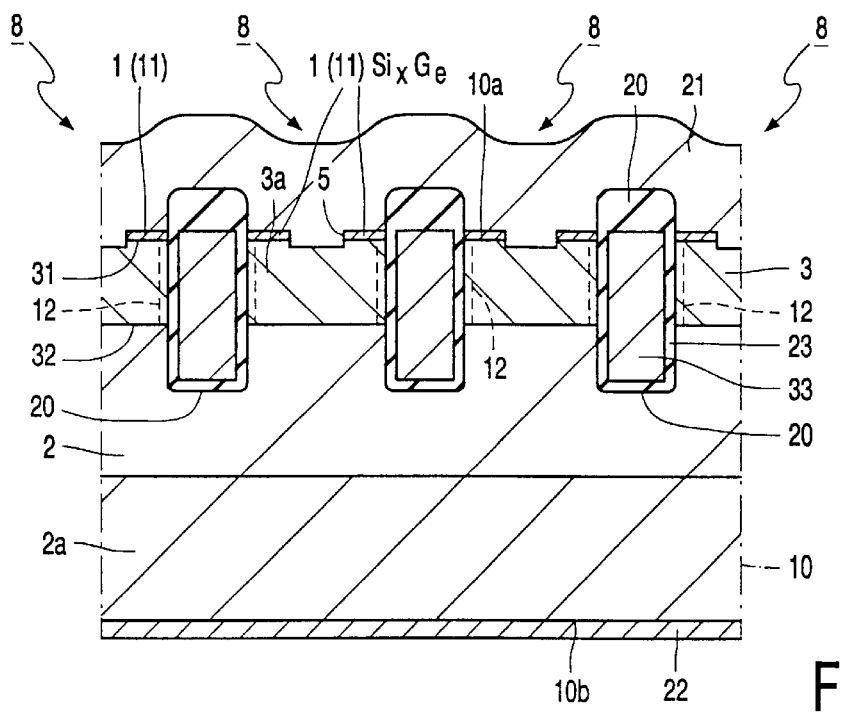
FIG. 1 is a cross-sectional view of an active central part of a trench-gate power semiconductor device in accordance with the invention.

It should be noted that all the Figures are diagrammatic and that relative dimensions and proportions of parts of the drawings have been shown exaggerated or reduced in size, for the sake of clarity and convenience in the drawings. Corresponding reference signs are generally used to refer to corresponding or similar features in modified and different embodiments, as well as in the prior art.

DESCRIPTION OF THE PREFERRED EMBODIMENTS

FIG. 1 illustrates an exemplary embodiment of a cellular power semiconductor device which has a trench-gate 33 and is constructed in accordance with the present invention. This trench-gate power device comprises a semiconductor body 10 which accommodates an array of parallel transistor cells 8 between first and second main electrodes 21 and 22. These electrodes 21 and 22 provide the terminals of the current-carrying path through the device.

In each active transistor cell area 8 of this device, a body region 3 of a first conductivity type (i.e. p-type in this example of FIG. 1) separates first and second regions 1 and 2 (source and drain, respectively) of an opposite second conductivity type (n-type in this example). Thus, the device has a plurality of the body regions 3 which are located side-by-side in the semiconductor body 10 and each of which forms p-n junctions 31 and 32 respectively with the source and drain regions 1 and 2.

The source region 1 of each cell 8 comprises a narrow-bandgap layer 11 of semiconductor material of a narrower energy bandgap than the semiconductor body 10. Typically, when the body 10 is of monocrystalline silicon, the source region 1 may comprise a mixed crystal of germanium and silicon ($Si_xGe_{(1-x)}$). The narrow-bandgap layer 11 provides side-by-side source regions 1 of the device which form with the side-by-side body regions 3 respective source p-n junctions 31 comprising the heterojunction. Because it is a layer 11 deposited on a major surface 10a of the semiconductor body 10, this narrow-bandgap source region 1 is outside the semiconductor body 10, and the resulting, combined p-n heterojunction 31 is formed at the body surface 10a.

The individual source regions 1 of the power-device cells are connected in common by the electrode 21 which forms a common source electrode to all the device cells of the array. The drain region 2 is also common to all the cells and underlies the body regions 3 in the semiconductor body 10.

The power device has a trench-gate 33 present in a trench 20 which extends from the body surface 10a through the body region 3 and into the drain region 2. The trench-gate 33 is capacitively coupled to the portion 3a of the body region 3 adjacent the sidewall of the trench 20 (across a gate insulating layer 23 in the FIG. 1 embodiment). This capacitive coupling serves in known manner for inducing in the portion 3a of the first conductivity type a conduction channel 12 of charge carriers of the second conductivity type (electrons in the FIG. 1 example) between the source and drain regions 1 and 2 in an on-state of the switch, by the application of a voltage signal to the gate 33. These channel-accommodating portions 3a of the side-by-side body regions 3 are connected in parallel between the source electrode 21 and the drain region 2.

As illustrated in FIG. 1, the source and drain p-n junctions 31 and 32 are of a plane geometry and terminate at the sidewalls of the trench 20.

Figure 2:
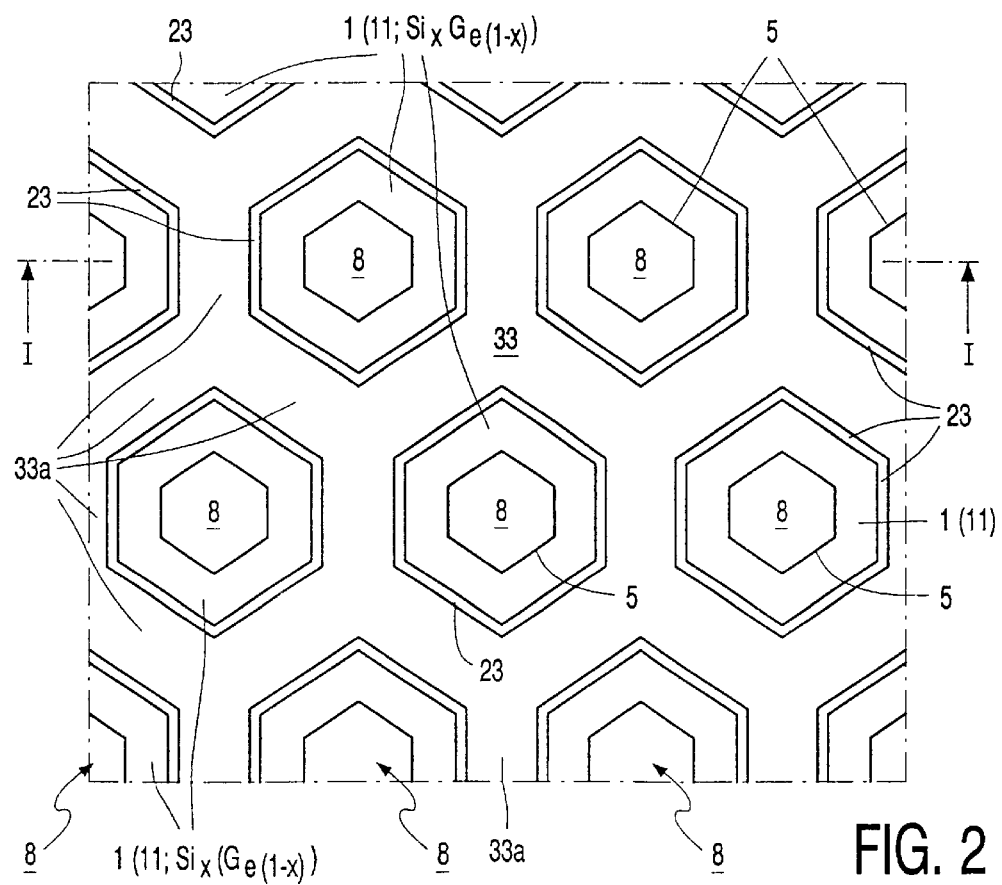
FIG. 2 is a plan view of the active central part of the device, with the cross-sectional view of FIG. 1 being taken on the line I—I of FIG. 2.

An exemplary embodiment of a cellular layout geometry for the power device is shown in FIG. 2, taken at the level of the body surface 10a. This FIG. 2 example is of a close-packed hexagonal geometry. However, the device structure of FIG. 1 may be implemented with quite different, known cell geometries, for example a square geometry or an elongate stripe geometry. In each case, the gate 33 in the trench 20 comprises grid portions 33a which extend between the channel-accommodating portions 3a of neighbouring side-by-side body regions 3.

In the layout of FIG. 2, the trenched grid portions 33a together form a network which extends around the boundary of each cell 8, as a common insulated-gate electrode of the array. Thus, the trench 20 laterally bounds the regions 1 and 3 in these cells, and part of the drain region 2. The trench-gate 33 is contacted outside the plane of the FIG. 1 drawing to provide the control, third terminal of the device. FIGS. 1 and 2 show only a few cells 8, but typically the device comprises many thousands of these parallel cells 8 between the electrodes 21 and 22.

By way of example, FIG. 1 shows a vertical device structure in which the common second region 2 may be a drain-drift region formed by an epitaxial layer of high resistivity on a monocrystalline substrate region 2a of high conductivity. This substrate region 2a may be of the same conductivity type (n-type in this example) as the region 2 to provide a vertical MOSFET, or it may be of opposite conductivity type (p-type in this example) to provide a vertical IGBT. The substrate region 2a is contacted at the bottom major surface 10b of the device body by the electrode 22, called the drain electrode in the case of a MOSFET and called the anode electrode in the case of an IGBT.

The source electrode 21 (not shown in FIG. 2) extends as a unitary layer over the trench-gate 33, from which it is insulated by an intermediate insulating layer 20 on the trench-gate 33. The narrow-bandgap source-region layer 11 is absent from over an area of at least a number of the side-by-side body regions 3, so that the electrode 21 contacts these particular body regions 3 to precisely define the potential of the body region 3. In spite of the presence of the p-n heterojunction 31, it is beneficial in a power device to determine precisely the potential of the body region 3 in this way and not to leave it floating.

Thus, as illustrated in FIG. 1, the source electrode 21 extends on the narrow-bandgap source regions 1 and on the body regions 3 at the first major surface 10a of the body 10. In this way, the source electrode 31 short-circuits the p-n heterojunction 31, but away from the channel-accommodating portion 3a which is below the source region 1. Even in this situation the invention has the advantage of permitting the use of a low doping level and low resistivity for the body region 3, as appropriate for the channel-threshold voltage and voltage-blocking capability of the power device. All of the body regions 3 illustrated in FIGS. 1 and 2 are short-circuited in this way. In the form illustrated, the narrow-bandgap layer 11 still forms a source p-n junction 31 with these short-circuited body regions 3, but it has local openings 5 (of hexagonal outline in the FIG. 2 example) which are present where the electrode 21 short circuits these body regions 3 to their source region 1. Thus, in the FIG. 2 example, the source region 1 of each cell is in the form of an hexagonal ring.

The principle behind the heterojunction-source trench-gate power device of the present invention is the exploitation of a large difference in injection efficiency across a p-n heterojunction, in which the p-n junction 31 comprises a heterojunction between different bandgap semiconductor materials 11 and 3. In the following discussion it will be assumed that epitaxial $Si_xGe_{(1-x)}$ is used as the semiconductor material of the heavily doped (N+) n-type source region 1, whereas the body 10 (and hence the body regions 3) is of Noncrystalline silicon.

In p-n heterojunction 31, the heterojunction between Si and $Si_xGe_{(1-x)}$ is located within the zero-bias depletion layer of the p-n junction. The transition from p-type to n-type may coincide with the transition from Si to $Si_xGe_{(1-x)}$ (or vice versa, in the case of an opposite conductivity type device). In practice, a small amount of dopant diffusion from the higher-doped source region may occur during manufacture, so shifting the precise location of the p-n transition. To allow for such diffusion, a very thin portion of the opposite-type narrow-bandgap ($Si_xGe_{(1-x)}$) layer 11 may be deposited with the same conductivity type (p-type in this example) as the body regions 3, adjacent to the body regions 3. Thus, in the present example, the $Si_xGe_{(1-x)}$ layer 11 of the manufactured device may be wholly n-type; or a part of the $Si_xGe_{(1-x)}$ layer 11 may be low-doped p-type over a distance of less than about 5 nm (nanometres) from the p-type Si body regions 3, while being n-type over the remainder of its thickness. This very short distance of p-type $Si_xGe_{(1-x)}$ is within the zero-bias depletion layer of the p-n junction, i.e. it is a fully depleted part of the $Si_xGe_{(1-x)}$ layer 11.

It is not satisfactory to form the source region 1' of the power device by the implantation of both dopant ions and Ge ions in the silicon semiconductor body 10', because conventional Si-type device characteristics would then result with the $Si_xGe_{(1-x)}$ doing little more than adding a small series resistance. Instead, at the p-n junction 31, the source region 1 is made to be wholly $Si_xGe_{(1-x)}$ and the lower-doped body region 3 is wholly Si at least after a very short distance from the p-n transition itself.

Because the charge-carrier concentration on each side of the p-n heterojunction 31 is proportional to the exponential of (-Eg/kT), where Eg is the bandgap on that side of the heterojunction, a small change in bandgap can result in a very large difference in injection ratio. As a result, the injection from the wide bandgap side (Si) to the narrow bandgap side ($Si_xGe_{(1-x)}$) of a p-n heterojunction is much more efficient than the other way round, regardless of the doping levels normally used.

Figure 5:
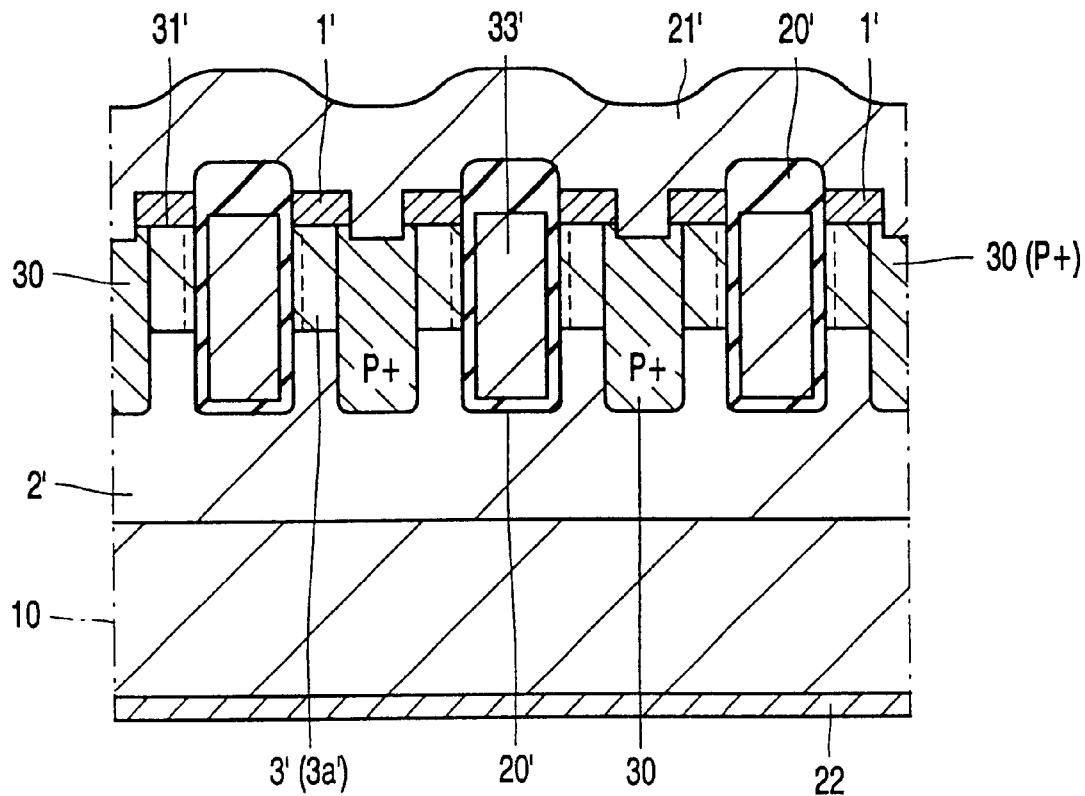
FIG. 5 is a cross-sectional view, similar to FIG. 1, but of a trench-gate power semiconductor device which is in accordance with the prior art, and hence is not an embodiment of the present invention.

FIG. 5 illustrates a known type of power device which is similar to that of FIGS. 1 and 2 but which has its source region 1' formed from monocrystalline Si. Thus, the source p-n junction 31' of the FIG. 5 device is a homojunction in monocrystalline Si and is not a heterojunction. There is a parasitic NPN bipolar transistor formed by the regions 1',2',3', with the region 11 as its emitter. During ruggedness testing (or avalanche fault conditions) of the FIG. 5 device, holes are collected by the p-type body regions 3' from the avalanche current, and these holes can forward bias the source p-n junction 31', so turning on the parasitic NPN transistor. Because the junction 31' is between a highly doped (N+) source region 1' and a low doped (P-) body region 3', electron injection from the n-type region 1' to the p-type region 3' is normally much higher than hole injection from the p-type region 3' to the n-type region 1'. Thus, every hole (from avalanche current) crossing this junction 31' may cause, for example, 10 electrons to come back in the opposite direction, which can provide a very efficient turn on of the parasitic transistor. This results in a failure of the power device by so-called "second breakdown". In order to reduce the efficiency of the parasitic transistor, it is conventional practice to include a high-doped portion 30 in the body region 3', outside the channel-accommodating portion 3a'. This requires extra manufacturing steps and extra layout area for each cell. Because the high-doped portion 30 cannot be provided in the channel-accommodating portion 3a', the parasitic NPN transistor is still present in this area.

The present invention side-steps these problems by changing the source region 1 to a narrower bandgap material such as $Si_xGe_{(1-x)}$, provided as a layer 11 at least adjacent to the p-n junction. The difference in bandgap at the resulting p-n heterojunction 31 means that the injection situation is reversed, so that injection of holes from the low-doped p-type body region 3 to the high-doped n-type source region 1 is now much higher than injection of electrons from the n-type source region 1 to the p-type body region 3. Thus, for example, 10 holes from the avalanche current may now cause only 1 electron to come back across the p-n heterojunction 31 from the n-type source region 1 to the p-type body region 3. This means that the parasitic NPN transistor does not turn on, and the second breakdown fault does not occur.

Thus, the present invention suppresses the parasitic NPN transistor without requiring the additional provision of the high-doped portion 30 of FIG. 5. The manufacturing process can be simplified, and a more compact layout for each device cell is possible. Furthermore, the p-n heterojunction 31 of the narrow-bandgap source region 1 in accordance with the invention is effective in suppressing the parasitic NPN transistor even in the area of the low-doped channel-accommodating portion 3a'.

Typically, the body 10 is of monocrystalline silicon, and the source-region layer 11 may comprise a mixed crystal of germanium and silicon ($Si_xGe_{(1-x)}$) epitaxially deposited on the body surface 10a at low temperature, for example about 700° C. Plasma enhanced chemical vapour deposition (PECVD) is particularly convenient, but other low-temperature deposition processes may alternatively be used, for example molecular beam epitaxy (MBE). The $Si_xGe_{(1-x)}$ material is deposited with the desired conductivity-determining dopant concentration (N+) of the source region 1, for example $10^{18}$ to $10^{21}$ phosphorus or arsenic or other donor atoms $cm^{-3}$. After providing the N+ doped $Si_xGe_{(1-x)}$ material on the body surface 10a, it is desirable to use only low temperature processing for any subsequent long processing steps, in order to avoid diffusion of the p-n junction beyond the heterojunction.

The source region 1 may be simply a single thin epitaxial layer 11 of $Si_xGe_{(1-x)}$ having a thickness in the range of, for example, 10 nm (nanometers) to 50 nm. The proportion (1−x) of Ge in this alloy layer 11 is chosen sufficiently high to provide the additional potential energy barrier required at the p-n junction 31 to give the desired injection ratios between the regions 1 and 3, without the crystal lattice at the heterojunction 31 being damaged by strain due to the lattice mismatch of Ge with Si. This can be achieved by choosing the product d.P of thickness (d in nm) of the layer 11 and its Ge atom percent (P) to be less than about 40 nm %. Typically the Ge content (1−x) in this mixed-crystal layer may be in the range of 0.1 to 0.3. The layer 11 may be doped with phosphorus so as to be n-type throughout its entire thickness, or at least throughout most of its thickness with less than 5 nm being boron-doped p-type adjacent to the boron-doped Si body regions 3. The short-circuit opening 5 is defined photolithographically and formed by etching through the $Si_xGe_{(1-x)}$ layer 11 and into the underlying Si body region 3.

The Si body region 3 may be an epitaxial layer deposited on the monocrystalline Si region 2 with a uniform doping concentration (P), or it may be s formed with a graded doping concentration (P) by implantation overdoping in the region 2. The graded doping concentration (P) may have a maximum value adjacent to the surface 10a. In a typical embodiment, the doping concentration (P) of the body region 3 (and hence of its channel-accommodating portion 3a) may be, for example, $10^{16}$ to $10^{17}$ boron atoms $cm^{-3}$. The thickness (depth below the surface 10a) of the body region 3 and the length of the channel 12 depends on the desired characteristics of the trench-gate power device. This dimension may be, for example, at least 0.5 $\mu$m in the case of a low-voltage power device (for example, operating at about 70 volts between the main electrodes 21 and 22). For a higher voltage device it is typically in excess of 1 $\mu$m. The depth of the trench 20 is somewhat deeper, for example, 0.7 $\mu$m to 1.5 $\mu$m. Typically the trench-gate 33 is of doped polycrystalline silicon on a gate insulating layer 23 of silicon dioxide, and the electrodes 21 and 22 may comprise, for example, aluminium.

Thus, the power device structure of FIG. 1 is similar to that of a conventional trench-gate MOSFET and may be manufactured using known MOSFET technologies, except for formation of the p-n heterojunctions 31 with the narrow-bandgap layer 11 of the source region 1. The active cellular area of the switch may be bounded around the periphery of the body 10 by any one of a variety of known MOSFET peripheral termination schemes, which are not shown in FIG. 1. Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

In the FIG. 1 device, the narrow-bandgap layer 11 is discontinuous, being absent where the trench-gate structure 33,21,20 extends into the body 10.

This device structure can be formed by first depositing the $Si_xGe_{(1-x)}$ source layer 11 and subsequently etching out the trench 20, growing the gate oxide layer 21, and depositing the gate polysilicon material 33 in the trench network. When the device is made in this way, the $Si_xGe_{(1-x)}$ layer 11 would not be provided on top of the trench-gate structure 33,21,20. However, the FIG. 1 device does have an insulating layer 20 at the top of the trench-gate structure 33,21,20.

Figure 3:
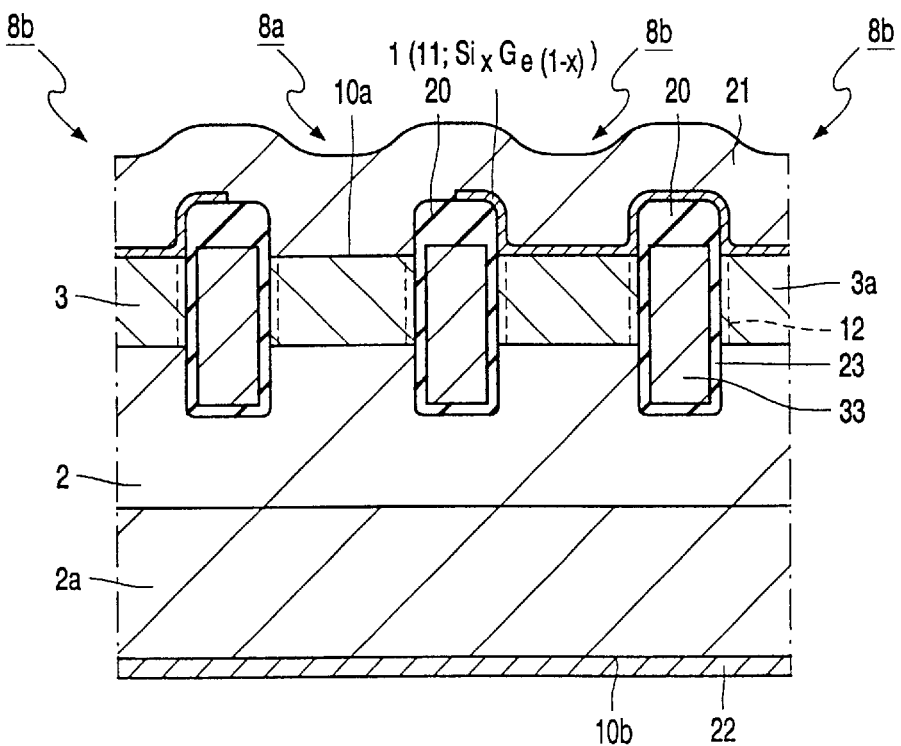
FIG. 3 is a cross-sectional view, similar to FIG. 1, but of a modified trench-gate power semiconductor device which is also in accordance with the invention.

FIG. 3 illustrates a modified device structure, also in accordance with the invention, in which the narrow-bandgap layer 11 extends over the insulating layer 20 on the grid portions 33a of the trench-gate structure 33,21,20. This device structure is formed by growing the $Si_xGe_{(1-x)}$ layer 11 after forming the trench-gate structure 33,21,20 in the Si body 10. An advantage of this process is that it avoids putting the $Si_xGe_{(1-x)}$ layer 11 through the processing steps for is forming the trench-gate structure 33,21,20. In this device structure, the narrow-bandgap layer 11 may extend as a unitary layer over the side-by-side body regions 3 and over the insulating layer 20 on the grid portions of the trench-gate structure.

As already described, the source electrode 21 may comprise aluminium which is often used for the main electrodes of a power semiconductor device. As is known in the art, aluminium has a tendency to alloy with silicon, and so several known techniques have been devised to prevent an aluminium electrode from alloying through a silicon-comprising region contacted by the electrode. Such techniques can be used for the electrode 21 of a power device in accordance with the present invention to protect the p-n heterojunction 31. One such technique is the use of an aluminium alloy comprising a small percentage of silicon. Such an aluminium-silicon alloy (A1:Si) may be used for the electrode 21 of FIGS. 1 and 3. Another known technique which may be used to protect the thin $Si_xGe_{(1-x)}$ layer 11 is to interpose a thin layer of a barrier-metal (for example titanium or titanium nitride, or tungsten). Thus, a barrier layer 28 of such a metal can be deposited before depositing the bulk of the (aluminium-comprising) electrode 21 of FIGS. 1 and 3.

Figure 4:
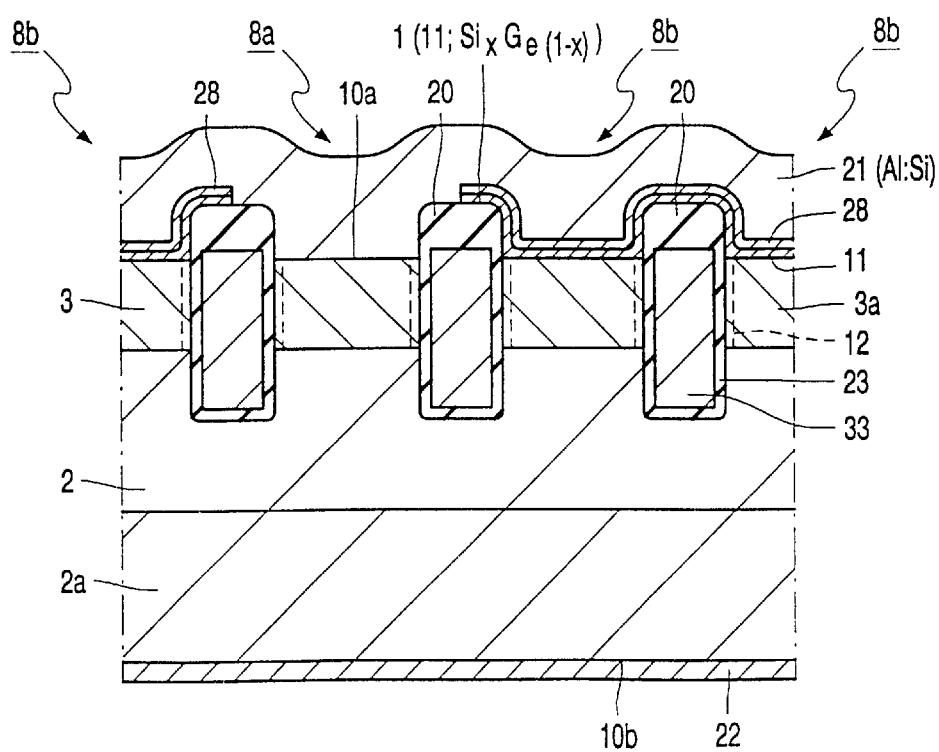
FIG. 4 is a cross-sectional view, similar to FIG. 3, of another trench-gate power device in accordance with the present invention, illustrating a further modification.

FIG. 4 illustrates an embodiment having a buffer layer 28 which may be such a barrier-metal. Alternatively, the layer 28 of FIG. 4 may be of silicon that is doped to have the same conductivity type as the $Si_xGe_{(1-x)}$ layer 11, so forming part of the n-type source region 1 of FIG. 4. Thus, a power device in accordance with the invention may have a composite source region 1 (11,28). However the effectiveness of the thin $Si_xGe_{(1-x)}$ layer 11 reduces as the thickness of the Si layer 28 increases. The use of buffer layers 28 may also be incorporated in the device embodiments of FIGS. 1 and 3.

All of the device cells 8 shown in FIGS. 1 and 2 have their body region 3 short-circuited to the source electrode 21. However, it is also possible for only a percentage of these body regions 3 to be short-circuited in this way. The number of short-circuited body regions 3 may be, for example, between 5% and 10% of the total plurality of the side-by-side body regions 3 of the power device. FIG. 3 illustrates such a situation in which only a percentage of the body regions 3 are short-circuited. In the device area illustrated in FIG. 3, there are four device cells, of which one cell 8a has a short-circuit whereas three cells 8b have body regions 3 without the short-circuit. With the non-shorted cells 8b, the narrow-bandgap layer 11 extends as a unitary layer over the side-by-side body regions 3 and over the insulating layer 20 on the trench-gate structure 33,21,20. These non-shorted cells 8b can occupy less layout area of the surface 10a than the cells 8 of FIG. 1, because each of the FIG. 1 cells 8 requires extra layout space to accommodate the short-circuit opening 5 within the cell area. Thus, a more compact device can be achieved by the adoption of non-shorted cells 8b. The narrow-bandgap layer 11 is discontinuous or otherwise absent where the short-circuit is formed in the cell 8a. FIG. 3 illustrates an extreme situation for the short-circuited cells 8a. In this extreme situation the narrow-bandgap layer 11 is absent from over the whole area of the short-circuited body regions 3 so that the narrow-bandgap layer 11 does not form a source p-n junction 21 with these short-circuited body regions 3.

It will be evident that many other modifications are possible within the scope of the invention. An n-channel device has been described with reference to FIGS. 1 to 4. However, a p-channel power device is also possible in accordance with the invention, in which the regions 1 and 2 are p-type, the base region 3 is n-type and the conduction channel 12 is of holes.

A vertical discrete device has been described with reference to FIGS. 1 to 4, having its second main electrode 22 contacting the back surface 10b of the body 10. However, an integrated power device is also possible in accordance with the invention. In this case, the region 2 may be a doped buried layer between a device substrate and an epitaxial body region 3. This doped buried-layer region 2 may be contacted by electrode 22 at the front major surface 10a of the body 10, via a doped peripheral contact region which extends from the surface 10a to the depth of the buried-layer region 2.

As already described, when the semiconductor body is of monocrystalline silicon, the narrow-bandgap layer 11 may advantageously comprise a mixed crystal $Si_xGe_{(1-x)}$ of germanium and silicon. However other known narrow-bandgap materials may be used, for example SiSn, or PbS, PbSe, PbTe, SnTe, ZnSb, InSb, or InAs, or mixed crystal alloys of these other semiconductors with Si.

From reading the present disclosure, other variations and modifications will be apparent to persons skilled in the art. Such variations and modifications may involve equivalent and other features which are already known in the design, manufacture and use of semiconductor devices and component parts thereof, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

What is claimed is:

1. A trench-gate semiconductor device comprising a semiconductor body having a first major surface from which a trench-gate structure extends into the body, the body including a body region of the first conductivity type which extends adjacent to the trench-gate structure, which body region provides the device with a channel-accommodating portion between first and second regions of an opposite second conductivity type in a current-carrying path of the device, the first region comprising a narrow-bandgap semiconductor material which is of the second conductivity type and of narrower energy bandgap than the semiconductor material of the body so providing a heterojunction, characterised in that the device is a power device having a plurality of the body regions which are located side-by-side in the body and which extend to the first major surface, the trench-gate structure comprises grid portions which extend between the channel-accommodating portions of neighbouring side-by-side body regions, the narrow-bandgap semiconductor material of the first region is provided outside the body by a narrow-bandgap layer, which narrow-bandgap layer is present on the first major surface to form the heterojunction with the body where the side-by-side body regions extend to the first major surface, the narrow-bandgap layer provides the side-by-side body regions with side-by-side source regions of the device which form with the body regions respective source p-n junctions comprising the heterojunction, the second region underlies the side-by-side body regions as a common region, and the channel-accommodating portions of the side-by-side body regions are connected in parallel between the common second region and a common main electrode of the side-by-side source regions. in that the narrow-bandgap layer is absent from over at least an area of a number of the side-by-side body regions so that the first main electrode contacts this number of the body regions so as to short circuit these body regions to the source region. and in that the narrow-bandgap layer is absent from over the whole area of said number of shorted body regions so that the narrow-bandgap layer does not form a source D-n junction with this number of the body regions.

2. A device as claimed in claim 1, further characterised in that the narrow-bandgap layer forms a source p-n junction with the said number of the body regions but has local openings which are present where the first main electrode short circuits these body regions to the source region.

3. A device as claimed in claim 1, further characterised in that the said number of shorted body regions is between 5% and 10% of the total plurality of the side-by-side body regions.

4. A device as claimed in claim 1 further characterised in that the narrow-bandgap layer is discontinuous, being absent where the trench-gate structure extends into the body.

5. A device as claimed in claim 1, further characterised in that an insulating layer is present on the grid portions of the trench-gate structure at the first major surface, and the narrow-bandgap layer extends over the insulating layer on the grid portions of the trench-gate structure.

6. A device as claimed in claim 5, further characterised in that the narrow-bandgap layer extends as a unitary layer over the side-by-side body regions and over the insulating layer on the grid portions of the trench-gate structure.

7. A device as claimed in claim 1, further characterised in that the narrow-bandgap layer comprises a mixed crystal of germanium and silicon, and the semiconductor body is of monocrystalline silicon.

8. A device as claimed in claim 7, further characterised in that a layer comprising aluminium provides at least a part of the first main electrode, and in that a buffer layer is present between the aluminium-comprising layer and the narrow-bandgap layer to protect the heterojunction from the aluminium-comprising layer.

9. A trench-gate semiconductor device comprising a semiconductor body having a first major surface from which a trench-gate structure extends into the body, the body including a body region of the first conductivity type which extends adjacent to the trench-gate structure, which body region provides the device with a channel-accommodating portion between first and second regions of an opposite second conductivity type in a current carrying path of the device, the first region comprising a narrow-bandgap semiconductor material which is of the second conductivity type and of narrower energy bandgap than the semiconductor material of the body so providing a heterojunction, characterised in that the device is a power device having a plurality of the body regions which are located side-by-side in the body and which extend to the first major surface, the trench-gate structure comprises grid portions which extend between the channel-accommodating portions of neighbouring side-by-side body regions, the narrow band-gap semiconductor material of the first region is provided outside the body by a narrow-bandgap layer, which narrow-bandgap layer is present on the first major surface to form the heterojunction with the body where the side-by-side body regions extends to the first major surface, the narrow-bandgap layer provides the side-by-side body regions with side-by-source regions of the device which form with the body regions respective source p-n junctions comprising the heterojuction, the second region underlies the side-by-side body regions as a common region, and the channel-accomodating portions of the side-by-side body regions are connected in parallel between the common second region and a common main electrode of the side-by-side source regions, further characterised in that an insulating layer is present on the grid portions of the trench-gate structure at the first major surface, and the narrow-bandgap layer extends over the insulating layer on the grid portions of the trench-gate structure.

10. A device as claimed in claim 9, further characterised in that the narrow-bandgap layer extends as a unitary layer over the side-by-side body regions and over the insulating layer on the grid portions of the trench-gate structure.

* * * * *